(12) United States Patent
Taya et al.

(10) Patent No.: US 7,414,305 B2
(45) Date of Patent: Aug. 19, 2008

(54) CARRIER FOR STACKED TYPE SEMICONDUCTOR DEVICE AND METHOD OF FABRICATING STACKED TYPE SEMICONDUCTOR DEVICES

(75) Inventors: Koji Taya, Kawasaki (JP); Kouichi Meguro, Kawasaki (JP); Junichi Kasai, Kawasaki (JP); Yasuhiro Shinma, Kawasaki (JP); Masanori Onodera, Kawasaki (JP); Junji Tanaka, Kawasaki (JP); Murugasan Manikam Achari, Georgtown (MY)

(73) Assignee: Spansion LLC, Sunnyvale, CA (US)

( * ) Notice: Subject to any disclaimer, the term of this patent is extended or adjusted under 35 U.S.C. 154(b) by 169 days.

(21) Appl. No.: 11/341,984

(22) Filed: Jan. 27, 2006

(65) Prior Publication Data

US 2006/0245908 A1 Nov. 2, 2006

Related U.S. Application Data

(63) Continuation of application No. PCT/JP2005/001247, filed on Jan. 28, 2005.

(51) Int. Cl.
*H01L 23/02* (2006.01)

(52) U.S. Cl. .................. 257/686; 257/730; 257/712; 257/685; 257/E21.607

(58) Field of Classification Search .................. None
See application file for complete search history.

(56) References Cited

U.S. PATENT DOCUMENTS 5,777,381 A * 7/1998 Nishida .............. 257/693

6,190,944 B1 2/2001 Choi
2002/0017709 A1 2/2002 Yanagisawa et al.
2002/0074630 A1 6/2002 Ando et al.
2004/0251530 A1 12/2004 Yamaji

FOREIGN PATENT DOCUMENTS

| JP | 2000-216333 | 8/2000 |
|----|-------------|--------|
| JP | 2001-223297 | 8/2001 |
| JP | 2001-274319 | 10/2001 |
| JP | 2001-352035 | 12/2001 |
| JP | 2005-005529 | 1/2005 |

* cited by examiner

*Primary Examiner*—A. Sefer
*Assistant Examiner*—Scott R Wilson
(74) *Attorney, Agent, or Firm*—Ingrassia Fisher & Lorenz, P.C.

(57) ABSTRACT

A carrier for a stacked-type semiconductor device includes an accommodating section for accommodating stacked semiconductor devices, guide portions guiding the stacked semiconductor devices, and grooves through which a fluid may flow to the accommodating section and to sides of the stacked semiconductor devices. These grooves facilitate the flow of gas or liquid on the sides of the accommodating sections, and it is thus expected that the flow of hot wind during the reflow process and cleaning liquid during the cleaning process can be facilitated. This improves the production yield and the cleaning effects. Holes for connecting the accommodating section to the outside may be provided at corners of the accommodating section. Gas may be guided from the lower side of the accommodating section, so that heat can be efficiently applied to the semiconductor devices and bonding failures therebetween can be reduced. Further, grooves connecting adjacent holes may be provided for accommodating sections adjacent to each other.

15 Claims, 4 Drawing Sheets

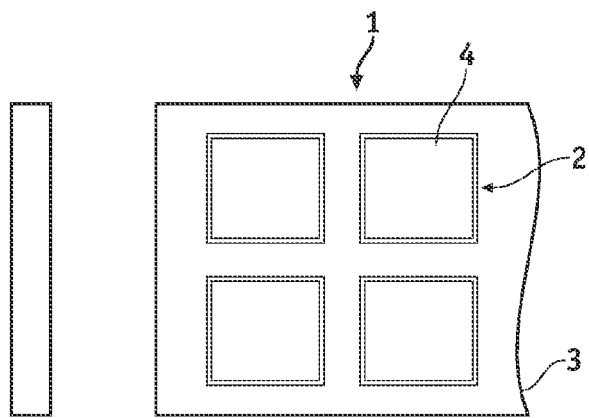
FIG. 1A
PRIOR ART
FIG. 1B
PRIOR ART
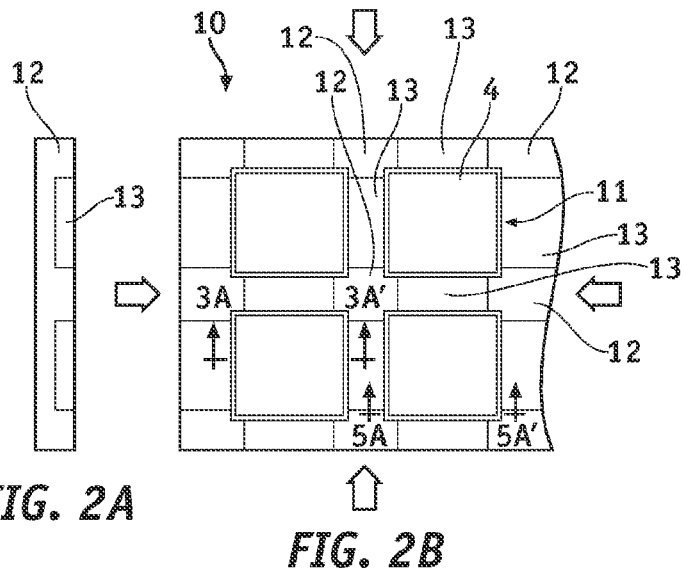
FIG. 2A
FIG. 2B
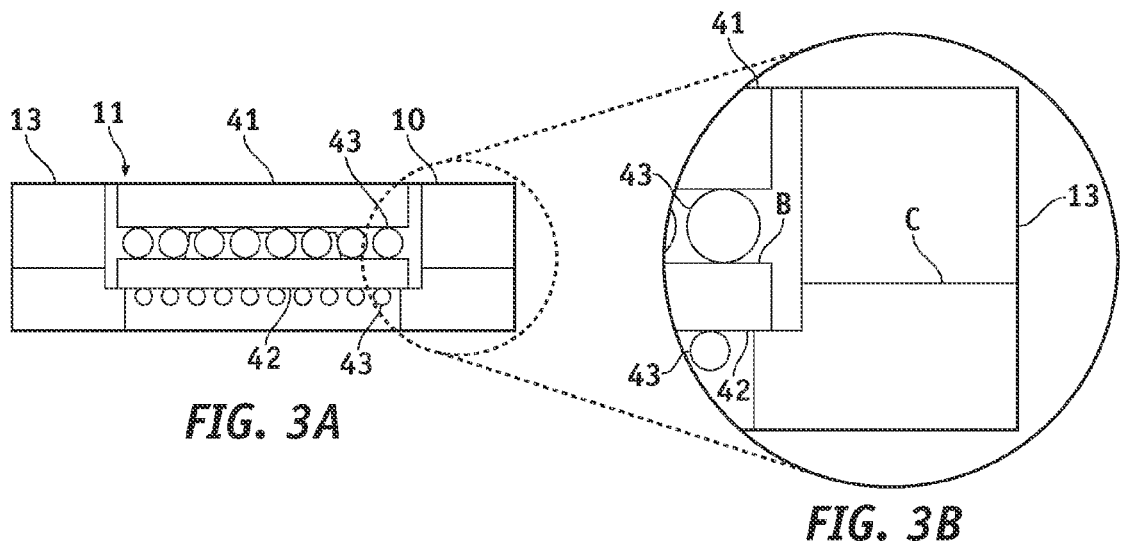
FIG. 3A
FIG. 3B

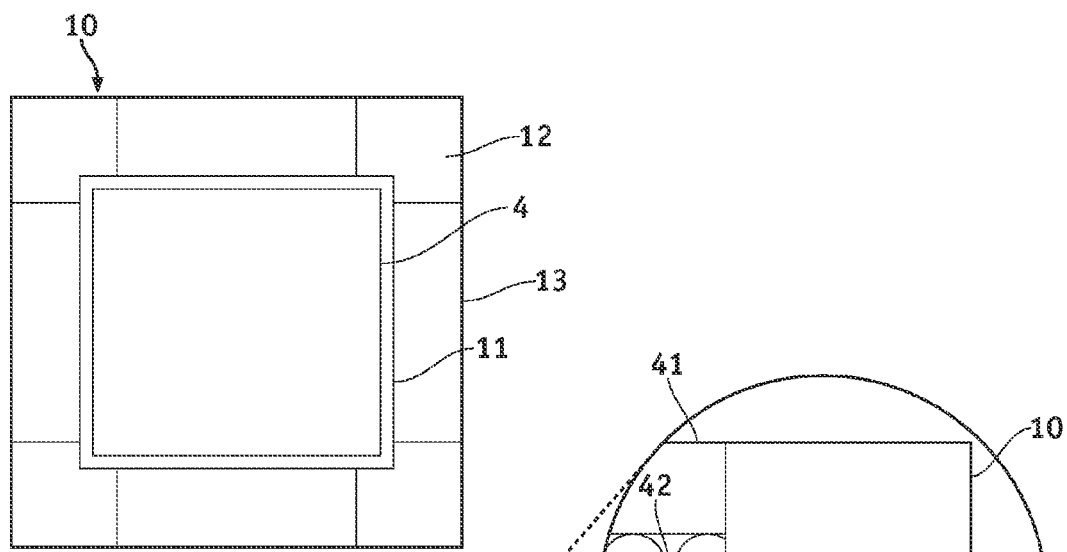
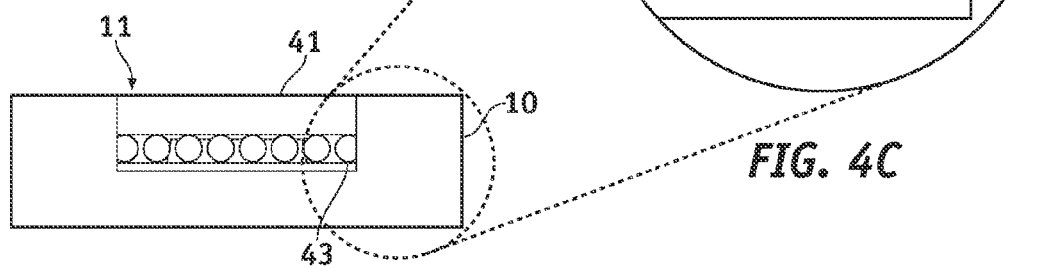
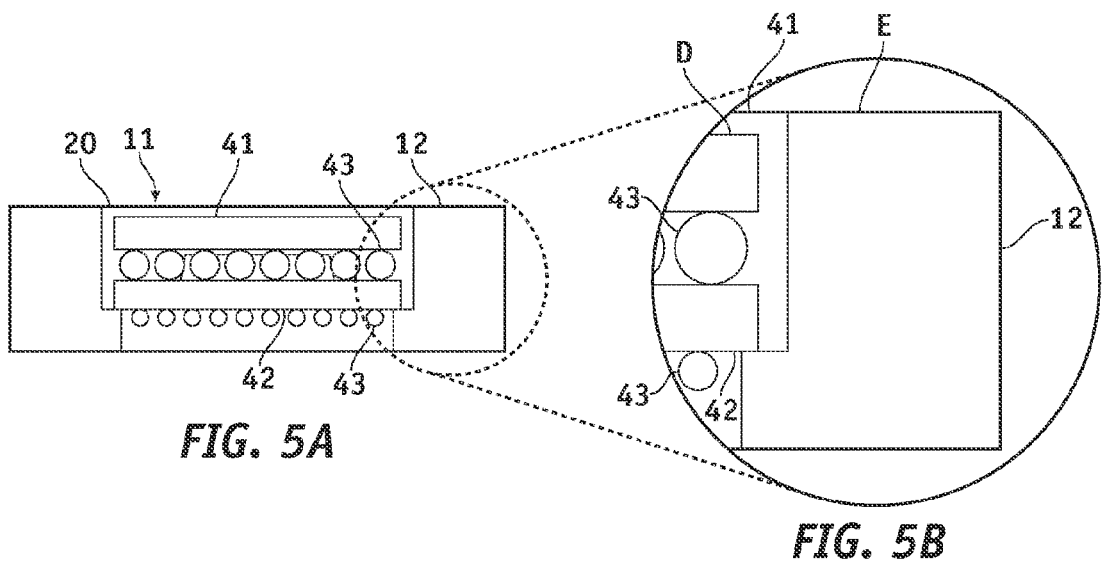

CARRIER FOR STACKED TYPE SEMICONDUCTOR DEVICE AND METHOD OF FABRICATING STACKED TYPE SEMICONDUCTOR DEVICES

CROSS-REFERENCES TO RELATED APPLICATIONS

This is a continuation application of International Application No. PCT/JP2005/001247 filed Jan. 28, 2005, which was not published in English under PCT Article 21(2).

BACKGROUND

1. Field of the Invention

The present invention relates to a carrier for semiconductor devices and a method of fabricating stacked-type semiconductor devices.

2. Description of the Related Art

Recently, portable electronic equipment such as mobile telephones and non-volatile semiconductor memory media such as IC memory cards have been downsized, and there has been increasing demands for reducing the number of parts used in the equipment and media to downsize such equipment and media. Thus, there has been considerable activity in the development of efficiently packaging semiconductor chips, essential elements among the structural components used in the equipment and memory media.

Examples of packages that meet the such demands are a chip scale package (CSP) having a package size substantially equal to that of the semiconductor chip, a multi-chip package (MCP) wherein multiple semiconductor chips are incorporated into a single package, and a package-on-package (POP) in which multiple packages are stacked and combined into a single-piece member.

FIGS. 1(a) and 1(b) show a conventional carrier for stacked-type semiconductor devices (hereinafter simply referred to as a carrier). More specifically, FIG. 1(a) is a side view of a carrier 1, and FIG. 1(b) is a top view thereof. The carrier 1 is used in the process of fabricating stacked-type semiconductor devices. The carrier 1 includes accommodating sections 2 for accommodating semiconductor devices 4, and guides 3 for the semiconductor devices 4. The stacked-type semiconductor devices may be fabricated through a reflow process and a cleaning process. In the reflow process, hot wind is applied to the stacked-type semiconductor devices 4, which are thus heated. The cleaning process may use a liquid for cleaning.

However, the conventional fabrication process for stacked-type semiconductor devices uses solder for stacking the semiconductor devices, and hot wind is needed to melt the solder for bonding during the reflow process. It is also necessary to guide the sides of the stacked semiconductor devices so as to prevent the stacked semiconductor devices from deviating laterally. However, guiding all of the sides of the semiconductor devices may prevent the devices and bonding portions thereof from having a sufficient temperature during reflow with hot wind to adequately melt the solder, and a bonding failure may occur. There is another disadvantage in the cleaning process. When cleaning the bonding portions of the stacked semiconductor devices that are put in liquid, the sides of the semiconductor devices that are all guided prevent liquid from flowing efficiently and effectively, thereby degrading the cleaning effects.

SUMMARY OF THE INVENTION

The present invention has been made taking the above into consideration, and has an object of providing a carrier for stacked-type semiconductor devices and a method of fabricating stacked-type semiconductor devices that realize improved production yield and cleaning effects.

The above object of the present invention is achieved by a carrier for a stacked-type semiconductor device comprising an accommodating section for accommodating stacked semiconductor devices, guide portions guiding the stacked semiconductor devices, and first grooves through which a fluid may flow to the accommodating section from sides of the stacked semiconductor devices. These grooves facilitate the flow of gas or liquid on the sides of the accommodating sections, so that the flow of hot wind in the reflow process and the cleaning liquid in the cleaning process can be facilitated, thereby improving the production yield and the cleaning effects.

The carrier may further include holes provided at corners of the accommodating section. With this structure, gas may be guided from the lower side of the accommodating section, and heat may be efficiently applied to the semiconductor devices. This contributes to reducing bonding failures of bonding portions between the semiconductor devices. The carrier may further include second grooves connecting adjacent holes provided in adjacent accommodating sections to each other. The carrier may also include third grooves connecting holes to outside the carrier through a side of the carrier. The carrier may further include holes that are provided in the first grooves and connect the first grooves to outside the carrier through a bottom of the carrier.

The first grooves may be provided along sides of the stacked semiconductor devices, so that gas or liquid can be applied to all the sides of the semiconductor devices. The first and third grooves may be deeper than a top of a lowermost one of the stacked semiconductor devices (where the top of the lowermost semiconductor device is coupled to another semiconductor device mounted thereon). This makes it possible to broadly apply heat to the bonding portions between the semiconductor devices during reflow with hot wind and to facilitate the flow of cleaning liquid during the cleaning step. It therefore improves both the production yield and the cleaning effects.

The first grooves may include a groove via through which a part of a terminal located at an end of the stacked semiconductor devices is exposed to outside the carrier. It is thus possible to broadly apply heat to the bonding portions of the semiconductor devices during reflow with hot wind and to facilitate the flow of cleaning liquid during the cleaning step.

The first grooves may become wider towards the sides of the carrier. This further facilitates the flow of hot wind during the reflow process and cleaning liquid during the cleaning step, and reduces the volume of the carrier. The reduced volume of the carrier restrains the thermal capacity thereof during the reflow process allowing the bonding portions of the semiconductor devices to melt at a lower temperature.

The guide portions may be higher than an uppermost one of the stacked semiconductor devices. With this arrangement, it is possible to prevent the occurrence of deviation in the stacked structure during transportation between the subsequent processes.

The guide portions may also be provided for at least two corners of the stacked semiconductor devices. Preferably, the accommodating section, the guide portions and the first grooves are portions of a single-piece member.

The present invention additionally includes a method for forming a stacked-type semiconductor device including the steps of stacking first and second semiconductor devices in an accommodating section of a carrier having guide portions guiding the first and second semiconductor devices and bonding the first and second semiconductor devices by reflow in which a fluid is applied to the accommodating section from sides of the first and second semiconductor devices through grooves of the carrier. The method may further include cleaning bonding portions of the first and second semiconductor devices through the grooves.

Thus, in accordance with the present invention, it is possible to provide a carrier for stacked-type semiconductor device and a method of fabricating stacked-type semiconductor devices capable of improving the production yield and cleaning effects.

BRIEF DESCRIPTION OF THE DRAWINGS

FIGS. 1(a) and 1(b) show a conventional carrier for stacked-type semiconductor devices;

FIGS. 2(a) and 2(b) show a carrier for stacked-type semiconductor devices in accordance with the present invention;

FIGS. 3(a) and 3(b) are cross-sectional views of the carrier in accordance with the present invention;

FIG. 4(a) is a top view of the carrier in accordance with the present invention, FIG. 4(b) is a front view thereof, and FIG. 4(c) is an enlarged view of an essential part of the carrier;

FIGS. 5(a) and 5(b) show another structure of the carrier for stacked-type semiconductor devices in accordance with the present invention;

DESCRIPTION OF THE PREFERRED EMBODIMENTS

Figure 6:
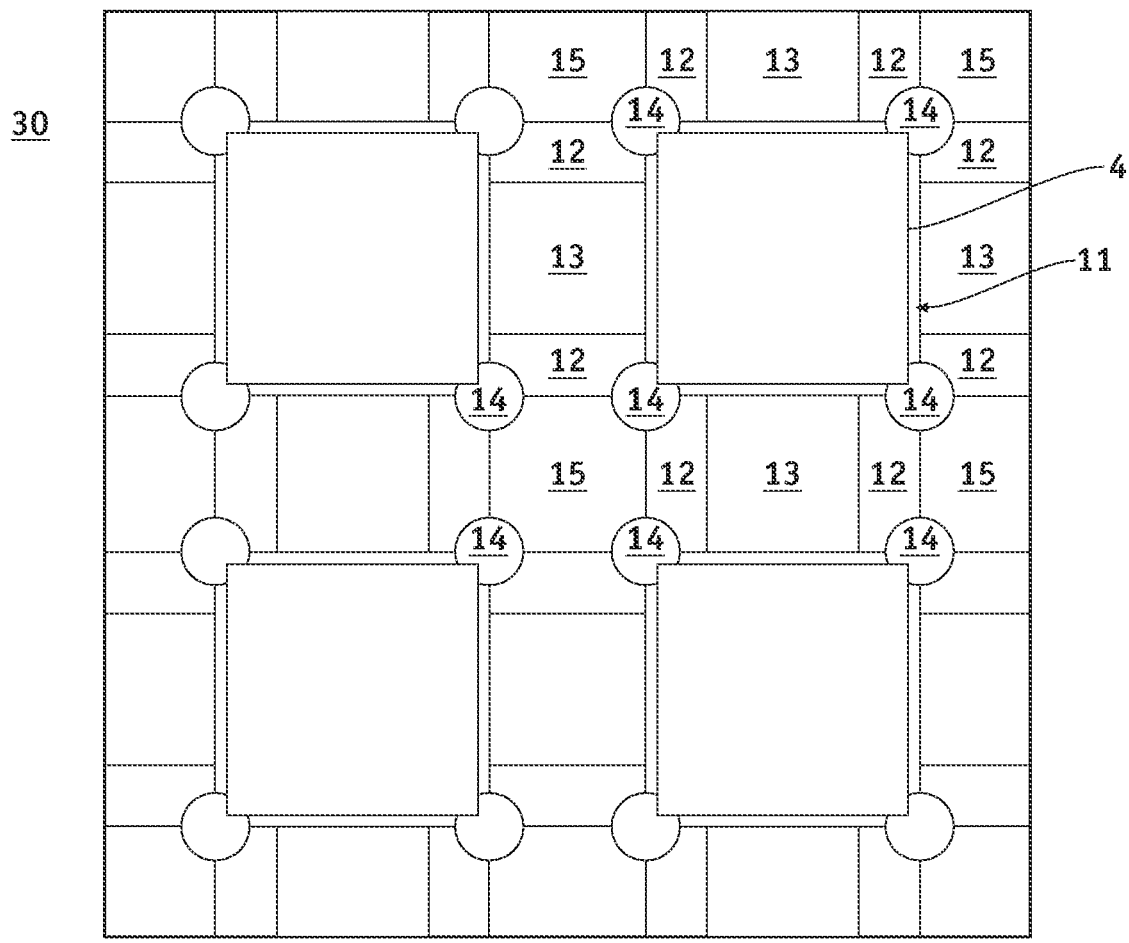
FIG. 6 is a top view of yet another carrier for stacked-type semiconductor devices in accordance with the present invention.

A description will now be given, with reference to the accompanying drawings, of embodiments of the present invention. FIGS. 2(a) and 2(b) show a carrier for stacked-type semiconductor devices in accordance with an embodiment of the present invention. Referring to FIGS. 2(a) and 2(b), a carrier 10 includes accommodating sections 11 for accommodating multiple semiconductor devices 4 to be stacked, guide portions $12_1$-$12_4$ for guiding the peripheries of the semiconductor devices 4, and grooves (first grooves) $13_1$-$13_4$ for guiding fluid such as gas or liquid from the side surfaces of the carrier 10 to the accommodating sections 11. Arrows indicate the flows of hot wind in a reflow process and those of cleaning liquid in a cleaning process. Preferably, the grooves 13 are provided for all sides of the semiconductor devices 4. Although FIG. 2(b) shows only four accommodating sections, the carrier used in practice may have a larger number of accommodating sections.

The grooves $13_1$-$13_4$ are provided to facilitate the flow of gas or liquid on the sides of the accommodating sections 11, so that the flow of hot wind in the reflow process and the cleaning liquid in the cleaning process can be facilitated. This improves the production yield and the cleaning effects. Further, the single carrier may be used for processing steps from the reflow process to the cleaning process. This reduces the number of parts and the cost.

The carrier 10 may be formed by cutting a metal plate, by casting or by forging, and is preferably a single-piece member. In International Applications PCT/JP2004/012476 and PCT/JP2004/006265, which were filed in the name of the same applicant as of the present application, the carriers are formed from separate parts. In contrast, in accordance with the present invention, the carrier 10 is a single-piece member formed by cutting of a metal plate, by casting or by forging and has high precision for processing. Further, the carrier 10 has high rigidity as compared to the separate-parts structure and may be less damaged during the assembly process of the stacked semiconductor devices.

FIG. 3(a) is a cross-sectional view taken along a line A-A' shown in FIG. 2(b), and FIG. 3(b) is an enlarged view of a part of the assembly shown in FIG. 2(a). As shown in FIG. 3(a), a lowermost semiconductor device 42 is placed in the accommodating section 11 of the carrier 10, and an uppermost semiconductor device 41 is then mounted on the lowermost semiconductor device 42. Connection terminals (solder balls) 43 are provided to the lower surfaces of the semiconductor devices 41 and 42. Electrode pads (not shown), which are connected to the connection terminals 43, are provided on an upper surface of a substrate of the semiconductor device 42. The stacked-type semiconductor device may be fabricated by applying hot wind from the grooves 13 and an opening provided below the lowermost semiconductor device 42 during reflow heating, thereby melting the connection terminals 43. The semiconductor device 41 may be a logic device, and the semiconductor device 42 may be a memory device such as a flash memory. In this case, the stacked-type semiconductor device includes the logic device and the memory device stacked together.

As shown in FIG. 3(b), the grooves 13 are made deeper than the upper surface B of the lowermost semiconductor device 42 (see a reference character C). This structure makes it possible to broadly apply heat to the bonding portions of the semiconductor devices 41 and 42 during the reflow process, and to broadly apply cleaning liquid thereto during the cleaning process. Thus, both the production yield and the cleaning effects can be improved.

FIG. 4(a) is a top view of the carrier in accordance with an embodiment of the present invention, FIG. 4(b) is a front view thereof, and FIG. 4(c) is an enlarged view of an essential part of the carrier. As shown in FIGS. 4(b) and 4(c), the grooves 13 are formed so that the connection terminals (solder balls) 43 located at the ends of the semiconductor device 4 can be partially viewed from sides P of the carrier 10. The grooves 13 are formed so that the connection terminals 43 located at the corners of the semiconductor device 4 can be partially viewed. This structure makes it possible to apply heat to the bonding portions located even at the ends of the semiconductor chips 41 and 42 during the reflow process and to apply cleaning liquid thereto during the cleaning process. Thus, both the production yield and the cleaning effects can be improved.

FIGS. 5(a) and 5(b) show another structure of the carrier for a stacked-type semiconductor device in accordance with present invention. More specifically, FIG. 5(a) is a view that corresponds to a cross section taken along a line B-B' shown in FIG. 2(b), and FIG. 5(b) is an enlarged view of a part of the assembly shown in FIG. 5(a). As shown in FIG. 5(a), the stacked-type semiconductor device composed of the semiconductor devices 41 and 42 are placed in the accommodating section 11. In accordance with the present invention, the semiconductor devices 41 and 42 are assembled within the carrier during the fabrication process for stacked-type semiconductor devices. Prior to the reflow process, the semiconductor devices 41 and 42 are merely stacked and are not bonded. Thus, the semiconductor devices 41 and 42 may move in relationship to each other after the stacking process and before the reflow process is finished. Thus, as shown in FIGS. 5(a) and 5(b), the guide portions 12 are formed so as to be higher than the uppermost semiconductor device 41 (see reference characters D and E). With this arrangement, it is possible to prevent the movement within the stacked structure during transportation between the fabrication processes.

FIG. 6 is a top view of yet another carrier for stacked-type semiconductor devices in accordance with the present invention. Referring to FIG. 6, a carrier 30 includes accommodating sections 11 for accommodating multiple semiconductor devices 4 stacked together, guide portions $12_1$-$12_4$ for guiding the peripheries of the semiconductor devices 4, grooves (first grooves) $13_1$-$13_4$ for guiding fluid such as gas or liquid from the side surfaces of the carrier 30 to the accommodating sections 11, through holes $14_1$-$14_4$ provided at corners of the accommodating sections 11, and grooves $15_1$-$15_4$ for connecting the through holes of the neighboring accommodating portions. The through holes 14 penetrate the carrier 30 and reach the backside thereof. Although the through holes 14 shown in FIG. 6 have a circular shape, the through holes 14 may have any other shape, such as, for example, a square shape.

The groove (second groove) $15_3$ functions to guide gas to the through holes $14_3$, $14_5$, $14_6$ and $14_7$ of the neighboring accommodating sections, and the grooves (third grooves) $15_1$, $15_2$, and $15_4$ connect the through holes to the outside of the carrier 30. With this structure, it is possible to apply heat to the corners of the semiconductor devices and to reduce bonding failures that occur at the corners of the semiconductor devices during the reflow process with hot wind.

Figure 7:
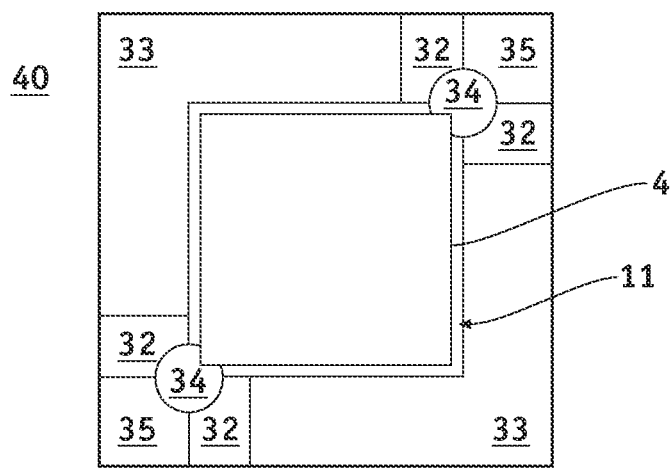
FIG. 7 shows a further carrier for stacked-type semiconductor devices in accordance with the present invention.

FIG. 7 shows yet a further carrier for stacked-type semiconductor devices in accordance with the present invention. As shown in FIG. 7, a carrier 40 includes an accommodating section 11 for accommodating a stacked semiconductor device 4, guide portions $32_1$ and $32_4$ for guiding only two corners among the four corners of the semiconductor device 4, grooves (first grooves) $33_1$ and $33_4$ for guiding fluid such as gas or liquid from the side surfaces of the carrier 40 to the accommodating section 11, through holes $34_1$ and $34_4$ provided at corners of the accommodating section 11, and grooves $35_1$ and $35_4$ for connecting the through holes through holes $34_1$ and $34_4$ to the outside of the carrier 40. In accordance with the present invention, the guides are provided to at least two corners among the four corners of the stacked semiconductor device 4.

Figure 8A:
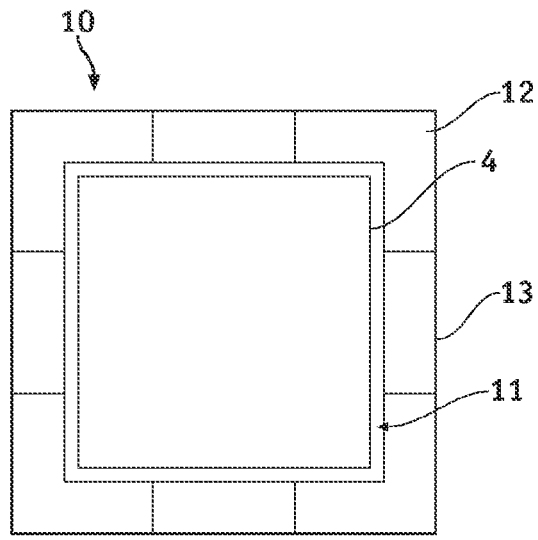
FIGS. 8(a) and 8(b) show a still further carrier for stacked-type semiconductor devices in accordance with the present invention.
Figure 8B:
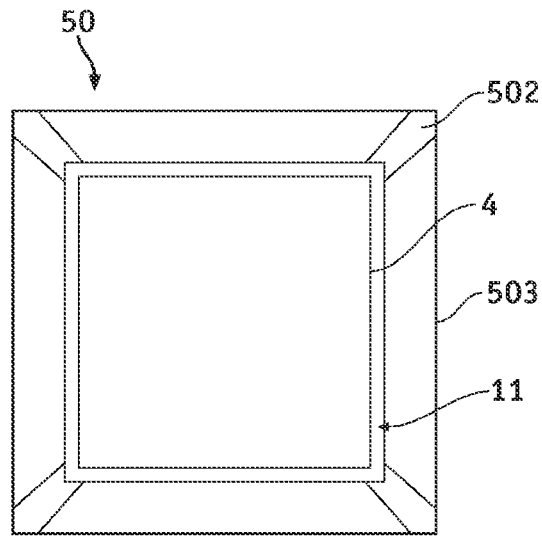

FIGS. 8(a) and 8(b) show a still further carrier for stacked-type semiconductor devices in accordance with the present invention. More particularly, FIG. 8(a) shows a carrier in which the grooves 13 are formed at an angle of ninety degrees with respect to the sides of the semiconductor device 4. FIG. 8(b) shows another carrier having grooves formed at an angle of 45 degrees with respect to the sides of the semiconductor device 4, in which a reference numeral 50 indicates a carrier, a reference numeral 502 indicates guides, and a reference numeral 503 indicates grooves. As shown in FIG. 8(b), the grooves 503 become wider towards the sides of the carrier 50 away from the accommodating section 11. This shape of the grooves 503 facilitates the flow of hot wind during the reflow process and cleaning liquid during the cleaning step, and reduces the volume of the carrier 50. The reduced volume of the carrier 50 reduces the thermal capacity thereof during the reflow process allowing the bonding portions of the semiconductor devices to be melted at a lower temperature.

Figure 9:
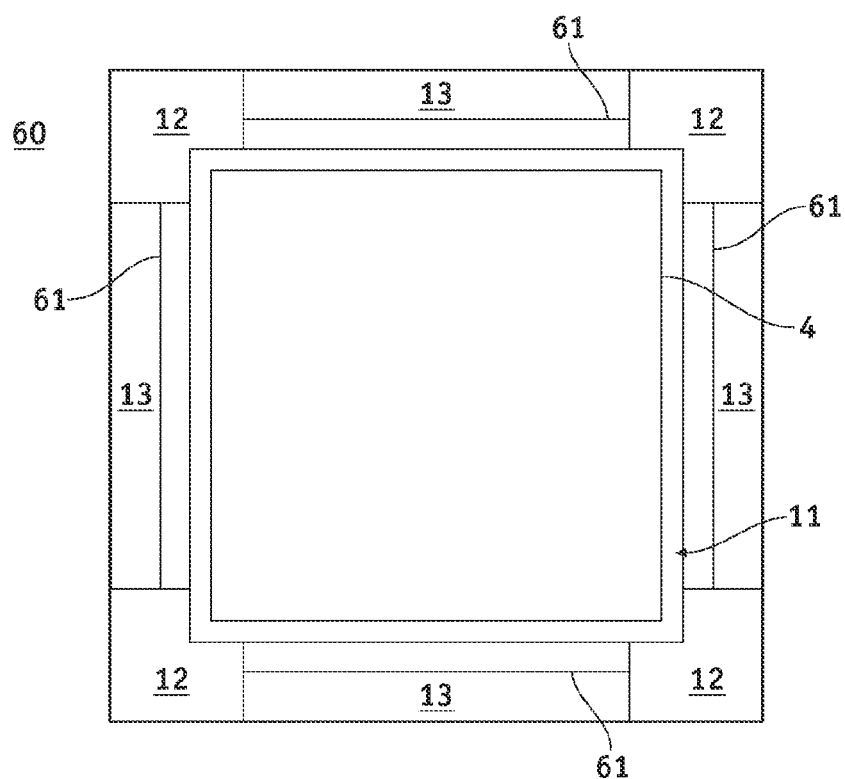
FIG. 9 is a view of another carrier for stacked-type semiconductor devices in accordance with the present invention.

FIG. 9 shows another carrier for stacked-type semiconductor device in accordance with the present invention. Referring to FIG. 9, a carrier 60 includes an accommodating section 11 for accommodating a stacked semiconductor device 4, guide portions $12_1$-$12_4$ for guiding the peripheries of the semiconductor device 4, grooves (first grooves) $13_1$-$13_4$ for guiding fluid such as gas or liquid from the side surfaces of the carrier 60 to the accommodating section 11, and holes $61_1$-$61_4$, which holes connect the grooves $13_1$-$13_4$ to the lower surface of the carrier 60. The holes $61_1$-$61_4$ penetrate through the carrier 60 from the grooves $13_1$-$13_4$. In practice, the carrier 60 has multiple accommodating sections as described with reference to FIGS. 2(a) and 2(b). The holes $61_1$-$61_4$ respectively provided in the grooves $13_1$-$13_4$ facilitate the flow of gas or liquid, so that the flow of hot wind during the reflow process and the cleaning liquid during the cleaning process can be facilitated. This improves the production yield and the cleaning effects. Further, the same carrier can be used from the reflow process to the cleaning process. This reduces the number of parts needed for manufacturing and the cost thereof.

Finally, a method of fabricating the stacked-type semiconductor device will be described with reference to FIGS. 2(a) through 3(b). In accordance with the present invention, a method of forming a stacked-type semiconductor device includes the steps of stacking the first and second semiconductor devices 41 and 42 in the accommodating section 11 of the carrier 10 having guide portions 12 guiding the first and second semiconductor devices, bonding the first and second semiconductor devices 41 and 42 by reflow during which a fluid is applied to the accommodating section 11 and thence to the sides of the first and second semiconductor devices 41 and 42 through grooves 13 of the carrier, and cleaning bonding portions of the first and second semiconductor devices 41 and 42 through the grooves 13.

The preferred embodiments of the present inventions have been described. However, the present invention is not limited to the specifically described embodiments, but may include various variations and modifications within the scope of the claimed invention.

What is claimed is:

1. A carrier for carrying a stacked-type semiconductor device during packaging thereof comprising:
 a plurality of accommodating sections for accommodating stacked semiconductor devices during packaging thereof;
 guide portions within each of the plurality of accommodating sections for guiding peripheries of the stacked semiconductor devices; and
 first grooves connecting with one or more of the plurality of accommodating sections through which a fluid may flow through the carrier to the one or more of the plurality of accommodating sections and to the peripheries of the stacked semiconductor devices accommodated within the one or more of the plurality of accommodating sections during the packaging of the stacked semiconductor devices.

2. The carrier as claimed in claim 1, further comprising holes provided at corners of the plurality of accommodating sections, wherein a portion of the periphery of one of the stacked semiconductor devices is accommodated within the holes at the corners of one of the plurality of accommodating sections when the one of the stacked semiconductor devices is accommodated within the one of the plurality of accommodating sections.

3. The carrier as claimed in claim 2, further comprising second grooves connecting adjacent ones of the holes provided in adjacent ones of the plurality of accommodating sections to each other.

4. The carrier as claimed in claim 2, further comprising third grooves connecting the holes through a side of the carrier to outside the carrier.

5. The carrier as claimed in claim 4, wherein the stacked semiconductor devices include a lowermost one thereof, and wherein the first and third grooves are deeper than a top of the lowermost one of the stacked semiconductor devices.

6. The carrier as claimed in claim 1, further comprising holes that are provided in the first grooves and penetrate through the carrier to connect the first grooves to outside the carrier.

7. The carrier as claimed in claim 1, wherein the first grooves are provided along sides of the one or more of the plurality of accommodating sections wherein the peripheries of the stacked semiconductor devices are accommodated.

8. The carrier as claimed in claim 1, wherein the first grooves comprise a groove via through which a part of a terminal located at an end of the stacked semiconductor devices is exposed to outside the carrier.

9. The carrier as claimed in claim 1, wherein sides of the first grooves are formed at an angle with respect to sides of the carrier such that the first grooves are wider at portions thereof towards the sides of the carrier than at portions thereof adjoining the accommodating section.

10. The carrier as claimed in claim 1, wherein the stacked semiconductor devices include an uppermost one thereof, and wherein a top of the guide portions is higher than an upper surface of the uppermost one of the stacked semiconductor devices.

11. The carrier as claimed in claim 1, wherein the guide portions are provided for at least two corners of the stacked semiconductor devices.

12. The carrier as claimed in claim 1, wherein the plurality of accommodating sections, the guide portions and the first grooves are each portions of an integrally-formed single-piece member.

13. The carrier as claimed in claim 12, wherein the integrally-formed single-piece member is a metal plate, and wherein the plurality of accommodating sections, the guide portions and the first grooves are formed by casting the metal plate.

14. The carrier as claimed in claim 12, wherein the integrally-formed single-piece member is a metal plate, and wherein the plurality of accommodating sections, the guide portions and the first grooves are formed by forging the metal plate.

15. The carrier as claimed in claim 12, wherein the integrally-formed single-piece member is a metal plate, and wherein the plurality of accommodating sections, the guide portions and the first grooves are formed by cutting the metal plate.

* * * * *